United States Patent
Borthakur et al.

(10) Patent No.: US 9,583,525 B2
(45) Date of Patent: Feb. 28, 2017

(54) DIE STACKED IMAGE SENSORS AND RELATED METHODS

(71) Applicant: SEMICONDUCTOR COMPONENTS INDUSTRIES, LLC, Phoenix, AZ (US)

(72) Inventors: Swarnal Borthakur, Boise, ID (US); Marc Sulfridge, Boise, ID (US); Vladimir Korobov, San Mateo, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/728,111

(22) Filed: Jun. 2, 2015

(65) Prior Publication Data

US 2016/0358966 A1    Dec. 8, 2016

(51) Int. Cl.
*H01L 27/146* (2006.01)

(52) U.S. Cl.
CPC ..... *H01L 27/14634* (2013.01); *H01L 27/1463* (2013.01); *H01L 27/1469* (2013.01); *H01L 27/14627* (2013.01); *H01L 27/14632* (2013.01); *H01L 27/14636* (2013.01); *H01L 27/14685* (2013.01); *H01L 27/14687* (2013.01)

(58) Field of Classification Search
CPC .............. H01L 27/14634; H01L 27/14627; H01L 27/1463; H01L 27/14632; H01L 27/14636; H01L 27/14685; H01L 27/14687; H01L 27/1469
See application file for complete search history.

(56) References Cited

U.S. PATENT DOCUMENTS

| | | | |
|---|---|---|---|
| 2011/0111560 A1* | 5/2011 | Purushothaman | H01L 21/76898 438/109 |
| 2015/0029374 A1* | 1/2015 | Kitano | H01L 27/14603 348/308 |
| 2015/0228584 A1* | 8/2015 | Huang | H01L 23/5384 257/774 |

OTHER PUBLICATIONS

On-chip Color Filter (Color Filter Array and Micro-Lens), Toppan, available at http://www.toppan.co.jp/english/products_service/pdf/OCF.pdf, last visited May 26, 2015.

* cited by examiner

*Primary Examiner* — Whitney T Moore
(74) *Attorney, Agent, or Firm* — Adam R. Stephenson, LTD.

(57) ABSTRACT

An image sensor. Implementations may include: a first die including a plurality of pixels; a second die including a plurality of transistors, capacitors, or both transistors and capacitors; a third die including analog circuitry, logic circuitry, or analog and logic circuitry. The first die may be hybrid bonded to the second die, and the second die may be fusion bonded to the third die. The plurality of transistors, capacitors or transistors and capacitors of the second die may be adapted to enable operation of the plurality of pixels of the first die. The analog circuitry, logic circuitry, and analog circuitry and logical circuitry may be adapted to perform signal routing.

3 Claims, 10 Drawing Sheets

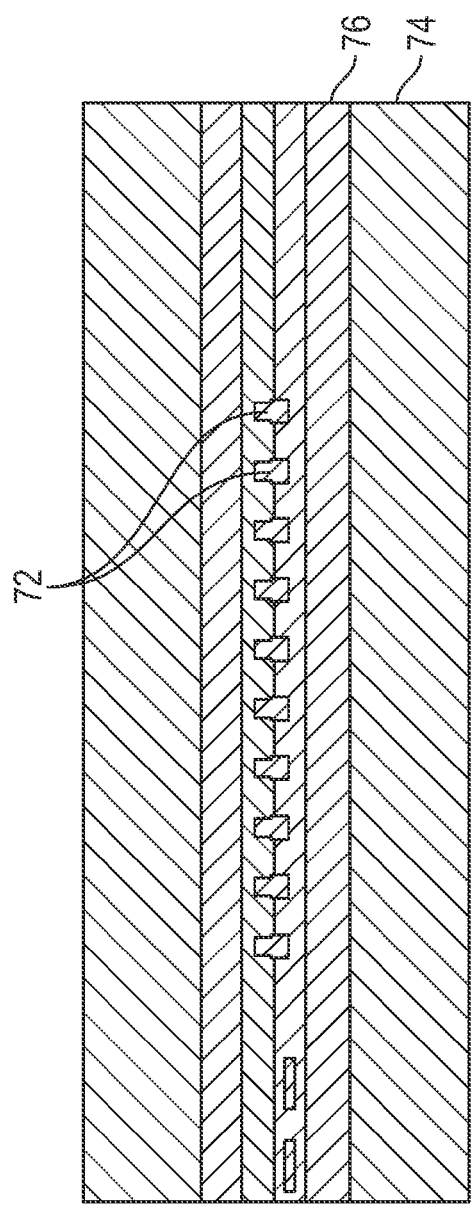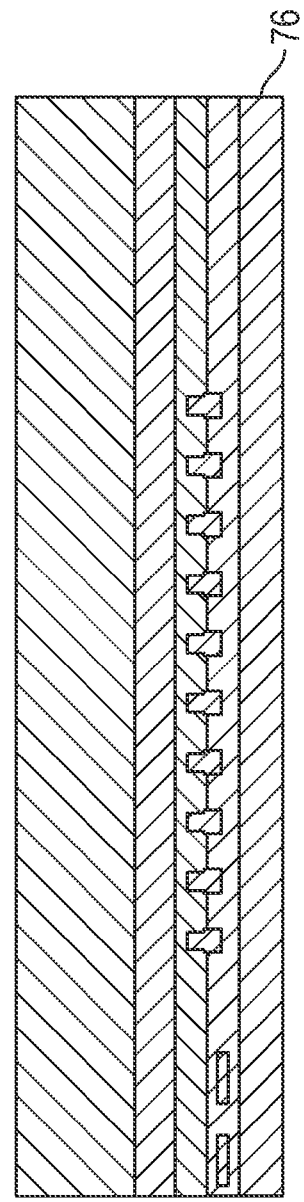
FIG. 17
FIG. 18

DIE STACKED IMAGE SENSORS AND RELATED METHODS

BACKGROUND

1. Technical Field

Aspects of this document relate generally to image sensors. More specific implementations involve image sensors that contain components made on more than one chip (die).

2. Background Art

Image sensors convey information related to an image by communicating signals in response to incident electromagnetic radiation. Image sensors are used in a variety of devices including smart phones, digital cameras, night vision devices, medical imagers, and many others. Semiconductor imagers utilizing charge-coupled device (CCD) and CMOS architectures exist in the art.

SUMMARY

Implementations of image sensors may include: a first die including a plurality of detectors adapted to convert photons to electrons; a second die including a plurality of transistors, passive electrical components, or both transistors and passive electrical components; a third die including analog circuitry, logic circuitry, or analog and logic circuitry. The first die may be hybrid bonded to the second die, and the second die may be fusion bonded to the third die. The plurality of transistors, passive electrical components, or transistors and passive electrical components of the second die may be adapted to enable operation of the plurality of detectors of the first die. The analog circuitry, logic circuitry, and analog circuitry and logical circuitry may be adapted to perform signal routing.

Implementations of image sensors may include one, all, or any of the following:

The second die may be bonded to the third die with an oxide/oxide fusion bond.

The second die may include deep trench isolation (DTI) structures configured to protect the plurality of the transistors, passive electrical components, or both transistors and passive electrical components during formation of a through oxide via (TOV).

The second die may be bonded to the third die with a hybrid bond.

The second die may include one or more through silicon vias (TSVs).

The sensor may further include a plurality of microlenses coupled to a surface of the plurality of detectors adapted to convert photons to electrons of the first die.

Implementations of image sensors may utilize an implementation of a method of manufacturing an image sensor. The method implementations may include hybrid bonding a first wafer including a plurality of first die with a second wafer including a plurality of second die and thinning the second wafer. The method may also include fusion bonding the second wafer with a third wafer including a plurality of third die. If the plurality of second die include deep trench isolation (DTI) structures, the method includes forming a plurality of through oxide vieas (TOVs). If the plurality of second die to not include DTI structures, then the method includes passivating the sidewalls of a plurality of vias (interconnect structures) with deposited oxide as part of forming a plurality of TOVs. The plurality of first die may each include a plurality of detectors adapted to convert photons to electrons. The plurality of second die may each include a plurality of transistors, passive electrical components, or both transistors and passive electrical components. The plurality of third die may each include analog circuitry, logic circuitry, or analog circuitry and logic circuitry.

Implementations of the method may include one, all, or any of the following:

The plurality of TOVs may electrically couple the plurality of first die with the plurality of third die.

The plurality of TOVs may electrically couple the plurality of second die with the plurality of third die.

The method may further include forming a plurality of microlenses on a surface of the plurality of detectors for each of the plurality of first die.

Implementations of image sensors may be formed using implementations of a method of manufacturing an image sensor. Implementations of the method may include hybrid bonding a first wafer including a plurality of first die with a second wafer including a plurality of second die and thinning the second wafer. The method may also include hybrid bonding the second wafer with a third wafer including a plurality of third die. The method may also include exposing a plurality of studs or forming a plurality of through silicon vias (TSVs). The plurality of first die may each include a plurality of detectors adapted to convert photons to electrons. The plurality of second die may each include a plurality of transistors, passive electrical components, or transistors and passive electrical components. The plurality of third die may each include analog circuitry, logic circuitry, or analog circuitry and logic circuitry.

Implementations of the method may include one, all, or any of the following:

The plurality of second die may be electrically coupled with the plurality of third die.

The method my further include forming a plurality of microlenses on a surface of the plurality of detectors of each of the plurality of first die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 17 is a cross sectional view of a die stacked image sensor following hybrid bonding of a first wafer and a second wafer;

FIG. 18 is a cross sectional view of a die stacked image sensor following thinning of the second wafer;

DESCRIPTION

Figure 1:
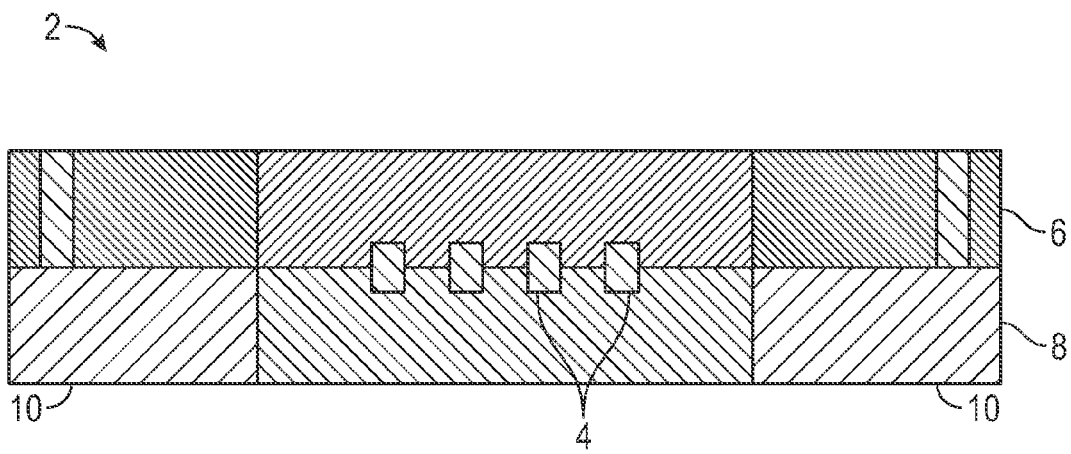
FIG. 1 is a cross sectional view of an implementation of a conventional two wafer hybrid bonded stacked die.

This disclosure, its aspects and implementations, are not limited to the specific components, assembly procedures or method elements disclosed herein. Many additional components, assembly procedures and/or method elements known in the art consistent with the intended die stacked image sensors will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such die stacked image sensors, and implementing components and methods, consistent with the intended operation and methods.

Image sensors are generally constructed as/from components of semiconductor devices. These components, formed using semiconductor processing techniques, generally include a plurality of detectors designed to convert photons to electrons. A wide variety of different devices and structures may be utilized in various implementations as detectors. These detectors may also include additional devices/components/circuitry used to operate the detectors and transfer signals from the detectors for processing in various parts of the image sensor. In particular implementations, these detectors may be pixels formed on a surface of the sensor. These pixels, in an array, occupy a certain portion of the surface area of the sensor. The operation of the pixels is controlled by various electrical components such as transistors and/or capacitors that are electrically coupled to each of the pixels. The output of the pixels is gathered and sent for subsequent processing via electrical routing and other signal processing components and circuitry, whether analog, logic, or both analog and logic (signal processing circuitry).

Reduction of the size of the image sensor can be achieved through what is referred to as pixel level stacking In pixel level stacking, all of the electrical components and associated routing and signal processing components are all located within the footprint of the pixel array of the sensor itself. In other words, the sensor needs to be no larger in dimension than the size of the pixel array. In various implementations, such pixel level stacking needs to use high density interconnect architectures in the order of greater than millions of interconnects. Pixel level stacking is performed by taking a die that contains the pixel array (first die) and bonding to a die that connects the interconnects and electrical components for operating the pixels (second die). In conventional solutions, however, the area needed to establish pixel level stacking interconnects is the same size as the pixel array, and so the signal processing circuitry has to be also included on the second die, requiring that the second die be larger in size than the first die. Because the second die is larger than the first die containing the pixel array, the sensor size reduction potentially achievable through pixel level stacking cannot fully be realized.

Referring to FIG. 1, a cross sectional view of an implementation of a conventional pixel level stacked die 2 is illustrated. Pixel level interconnects 4 (not to scale) are shown linking the pixel array of the first die 6 to the second die 8 electrical components and routing. As illustrated, the additional areas 10 of the second die 8 contain the signal processing circuitry which is unable to fit or substantially fit within the dimensions of the pixel array itself.

Figure 2:
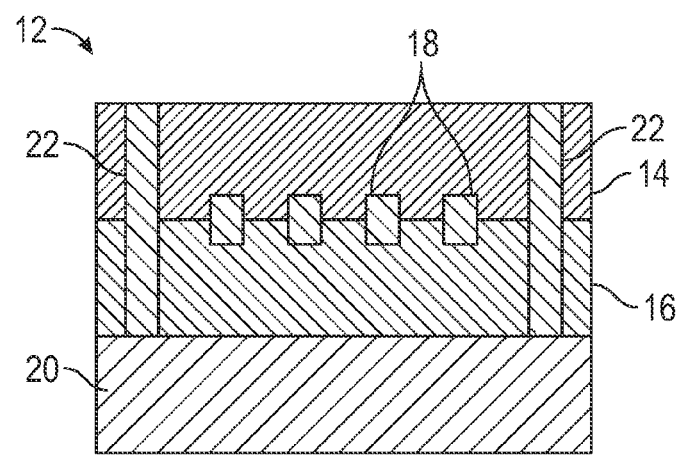
FIG. 2 is a cross sectional view of an implementation of a pixel level die stacked image sensor that includes die from three wafers.

Referring to FIG. 2, a cross sectional view of an implementation of a die stacked image sensor 12 is illustrated. As illustrated, the sensor 12 is formed of three stacked die: a first die 14 that includes a plurality of pixels arranged in a pixel array. In various implementations, the first die 14 may include transfer gates or transfer gates and anti-blooming transistor(s) for light emitting diode (LED) flicker mitigation and/or global shutter applications. A second die 16 is also include that contains the transistors, passive electrical components (such as capacitors, etc.), or both transistors and passive components used to operate each pixel and the pixel level interconnects 18. The second die 16 may also include a portion or all of the global shutter circuitry and/or feedback circuitry. A third die 20 is also included that contains the analog circuitry, logic circuitry, or both analog and logic circuity used to process and route the signals from the pixel array. While this particular breakdown of the various components forming the image sensor 12 by die may exist in various implementations, in other implementations, the different components/circuit elements may exist on more than one of or all of the stacked die. In various implementations disclosed herein, the first die 14, second die 16, and third die 20 are all bonded together through a wafer-scale bonding process; in other implementations, however they may be bonded together in a single chip-sized bonding process or sub-wafer level bonding process.

In the sensor implementations illustrated in FIG. 2, the first die 14 and second die 16 have been bonded using a hybrid bond. A hybrid bond refers to bonding between two materials that are dissimilar in at least one component, such as, by non-limiting example, silicon to oxide, metal to oxide, and so forth. The second die 16 is bonded to the third die 20 using a fusion bond. A fusion bond refers to bonding between materials that are similar, though this does not mean that they are chemically or structurally identical, such as, by non-limiting example oxide to oxide, metal to metal, silicon to silicon, and so forth. To enable electrical communication between the various die, via (interconnect) structures 22 are formed that electrically couple the die together. Via structures 22 that pass between die that are hybrid bonded are referred to as through silicon vias (TSVs); via structures 22 that pass between die that are fusion bonded using silicon dioxide or other oxides are referred to as through oxide vias (TOVs).

Various wafer bonding techniques and equipment may be utilized in various implementations including carrier wafer bonding/debonding techniques. In various implementations the wafer bonding equipment and processes marketed by EV Group (EVG) of Florian am Inn, Austria may be used to accomplish both the hybrid and fusion bonding. Various wafer thinning and preparation processes and techniques may also be employed. For the exemplary purposes of this disclosure, a full thickness silicon wafer at about 750-760 microns in thickness may be coarse ground down to about 200 microns in thickness. The wafer may, in some implementations, be bonded to a carrier for subsequent processing or may be processed directly. The wafer is then fine ground down to about 25 microns in thickness and polished using dry polishing processes, blanket dry or wet etching, and/or chemical mechanical polishing (CMP) techniques.

Various three-stacked die image sensor implementations and methods of making the same are disclosed herein. However, in various implementations, more than three die could be stacked using the principles disclosed herein. Also, in all of the implementations disclosed herein, the first wafer, second wafer, and third wafer may be bonded to one another face to face (wafer front side to wafer front side), back to face (wafer back side to wafer front side), or back to back (wafer back side to wafer back side). Any combination of face to face, back to face, or back to back hybrid or fusion bonds may be used for any particular one of the particular bonds made between wafers one, two and three in various implementations using the principles disclosed herein. Furthermore, while in this document wafers one and two are discussed being hybrid bonded together, in various implementations, they could be fusion bonded and wafers two and three, instead of being fusion bonded, could be hybrid bonded.

Figure 3:
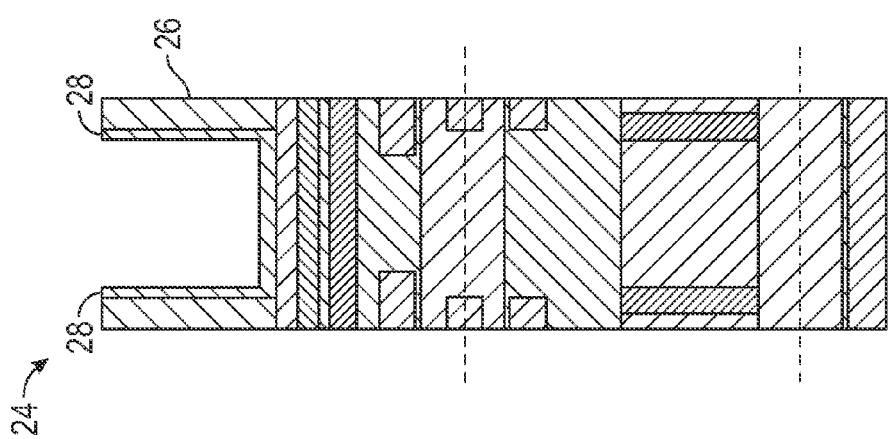
FIG. 3 is a cross sectional view of a three wafer die stack after a first set of processing operations for a first implementation of a method of forming a die stacked image sensor.

Referring to FIG. 3, a cross section 24 of a three wafer die stack after a first set of processing operations for a first implementation of a method of forming a die stacked image sensor is illustrated. For the purposes of illustration, this portion of the cross section 24 focuses on the interconnect structure to be formed between the three die, though the cross section 24 extends the width of the three wafers. The first set of processing operations has included hybrid bonding the first wafer containing the first die to the second wafer containing the second die, thinning the second wafer, passivating the second wafer, and fusion bonding the second wafer to the third wafer. In other implementations, however, the second wafer may be bonded to a carrier, thinned, fusion bonded to the third wafer, and then the carrier removed. Then a through oxide via (TOV) may be formed using any of the processing methods disclosed in this document between wafers two and three only. The first wafer is then hybrid bonded to the second wafer.

The demarcations between the three wafers in this figure and in subsequent figures are indicated by the dotted lines that cross the cross sections. Additionally, the silicon layer 26 has been photolithographically patterned and etched through. The etch process may be any wet or dry etch process used to perform silicon etching. Also, a sidewall passivation layer 28, typically of silicon dioxide (though other passivation materials could be used in various implementations) has been deposited/applied to the sidewall of the etched silicon. The sidewall passivation layer 28 acts to prevent ion or other metal contamination from migrating from the interconnect to the active devices contained in the first wafer during subsequent processing or device operating conditions.

Figure 5:
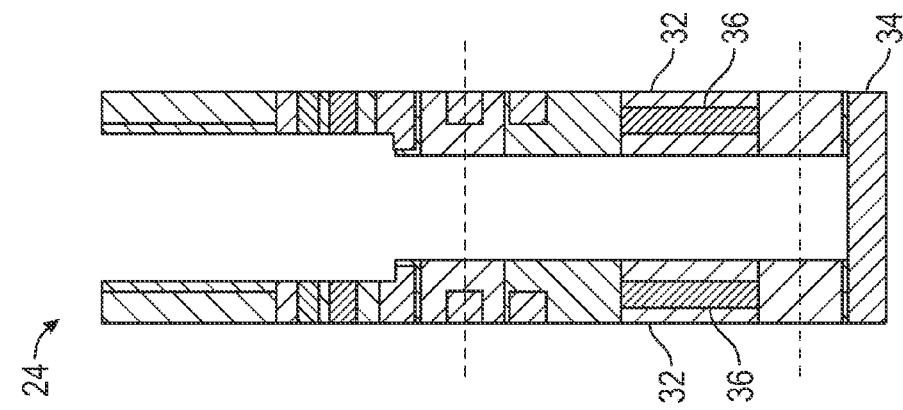
FIG. 5 is a cross sectional view of a three wafer die stack after a third set of processing operations for a first implementation of a method of forming a die stacked image sensor.
Figure 4:
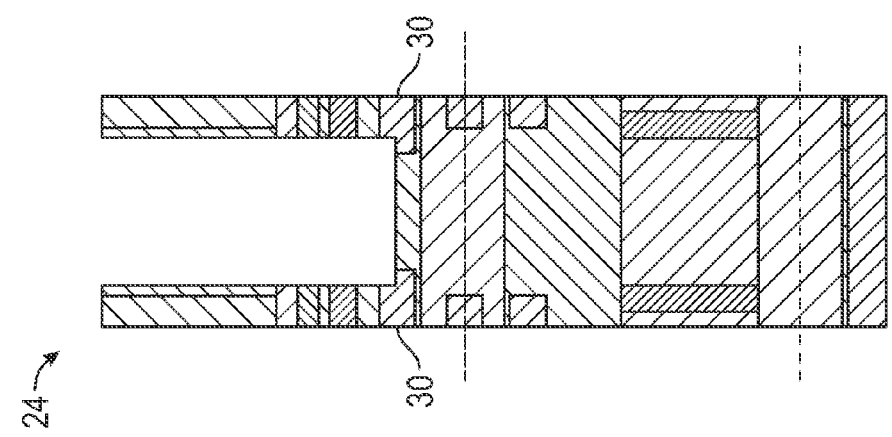
FIG. 4 is a cross sectional view of a three wafer die stack after a second set of processing operations for a first implementation of a method of forming a die stacked image sensor.

Referring to FIG. 4, the cross section 24 is illustrated following the additional processing step of patterning and etching of the interlayer dielectric (ILD) and other passivation materials of the first wafer, stopping on the metal layer (ring) 30 of the first wafer. As can be observed, in some implementations, this may result in some etching of the metal layer 30 itself. Referring to FIG. 5, a second patterning and etching step of the remaining ILD and oxide and other layers is then performed, followed by an etching of the silicon of the second wafer, stopping on the metal layer 34 of wafer three. As illustrated, the cross section 24 illustrates that wafer two contains deep trench isolation (DTI) structures 36 that encircle (surround) the opening being formed by the etching of the silicon of the second wafer. These DTI structures 36 can be formed using various methods, including deep reactive ion etching (or other silicon etch process etching) of the silicon, followed by oxide (or other passivating material) deposition into the trench. The DTI structures 36 will have been formed during processing of the second wafer prior to bonding operations. The DTI structures 36 operate similarly to the sidewall oxide in that it acts to prevent migration of ions or other metal contaminants into the electrical components formed in the silicon of the second wafer.

Figure 6:
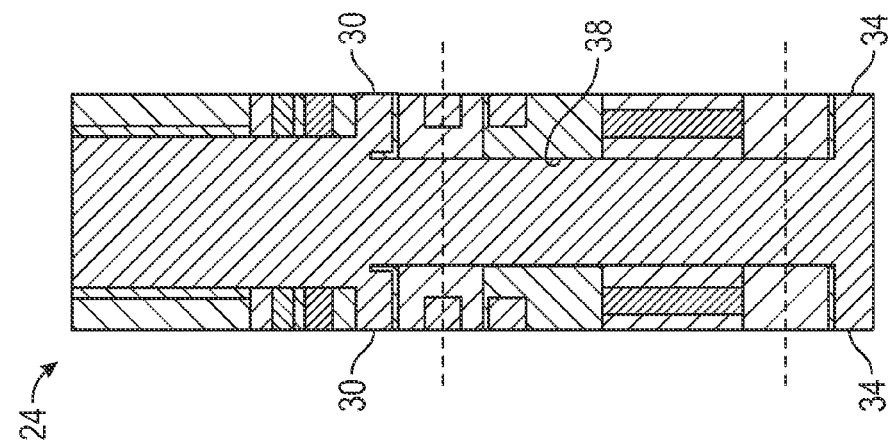
FIG. 6 is a cross sectional view of a three wafer die stack after a fourth set of processing operations for a first implementation of a method of forming a die stacked image sensor.

Referring to FIG. 6, the cross section 24 is illustrated after forming of the interconnect structure 38 within the opening down to the metal layer 34 of wafer three. The interconnect structure 38 is generally formed of copper through an electroplating process, though other metals and metal alloys capable of being deposited into the opening may be utilized in various implementations. In the first method implementation, the interconnect structure 38 electrically couples the metal layer 34 of wafer three to the metal layer 30 of wafer one. This permits signals from the pixels on wafer one (first die) to be exchanged with the routing circuitry and components on wafer three (third die).

Due to thinning and sizing of wafers one, two, and three, the aspect ratio during processing of the initial etch steps illustrated in FIGS. 3 and 4 may be less than 1:2. In particular implementations, by non-limiting example, the thickness of the bonded cross section from the top down to the upper portion of the metal layer 30 of wafer one (upper section) is about 4 microns. The width of the interconnect structure 38 in the upper section may be about 2.8 microns in particular implementations. The thickness of the bonded cross section from the upper portion of the metal layer 30 to the top of the metal layer 34 of the third wafer (second section) may be about 6.6 microns. The width of the interconnect structure 38 in the second section may be about 2 microns, which provides an aspect ratio during processing of less than 1:4. These aspect ratios may be within the ordinary capabilities of conventional semiconductor processing tools.

Figure 8:
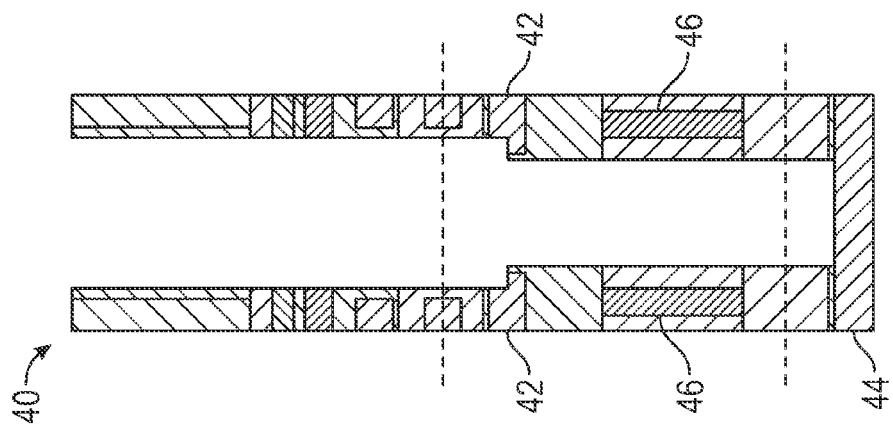
FIG. 8 is a cross sectional view of a three wafer die stack after a second set of processing operations for a second implementation of a method of forming a die stacked image sensor.
Figure 7:
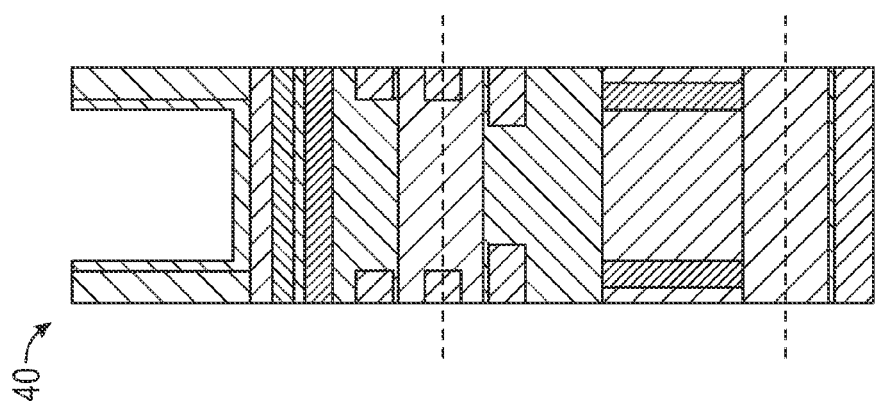
FIG. 7 is a cross sectional view of a three wafer die stack after a first set of processing operations for a second implementation of a method of forming a die stacked image sensor.
Figure 9:
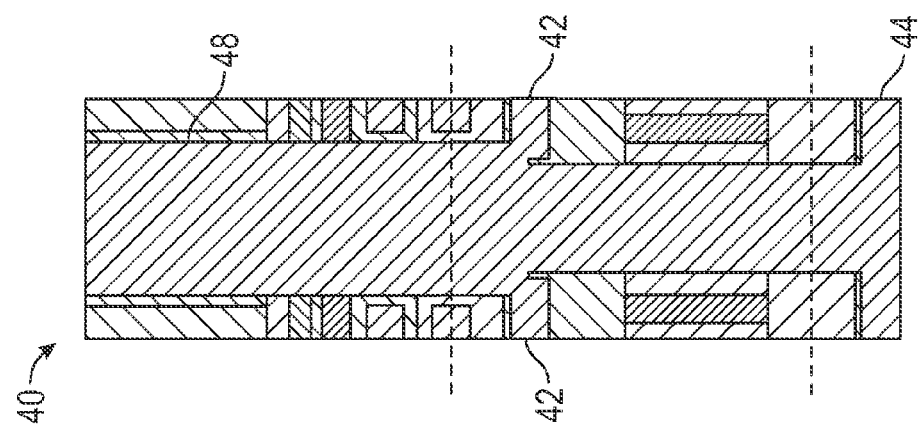
FIG. 9 is a cross sectional view of a three wafer die stack after a third set of processing operations for a second implementation of a method of forming a die stacked image sensor.

Referring to FIG. 7, a cross section 40 of a three wafer die stack following a first set of processing operations for a second implementation of a method of forming a die stacked image sensor is illustrated. Similarly to the cross section 24 illustrated in FIG. 3, silicon etching and sidewall passivation steps have been completed. Referring to FIG. 8, the cross section 40 is illustrated following initial patterning and etching of the ILD and other materials of the first wafer and the second wafer, stopping on the metal layer (ring) 42 of the second wafer. As previously discussed, some etching of the metal layer 42 can occur during this process. The cross section 40 also is shown following patterning and etching of the remaining ILD, oxides, and silicon of the second wafer down to the metal layer 44 of wafer three. In this method implementation, DTI structures 46 are also present, which serve to protect the components formed in the silicon of the second wafer. Referring to FIG. 9, the cross section 40 is illustrated following formation of the interconnect structure 48 which may be created using any of the methods disclosed herein. As illustrated, the interconnect structure 48 electrically couples the metal layer 44 of the third wafer (third die) to the metal layer 42 of the second wafer (second die), providing a connection between the electrical components on the second wafer and the routing and signal processing circuitry of the third wafer.

For the exemplary purposes of this disclosure, the thickness of the bonded cross section from the top of wafer one to the top of the metal layer 42 of wafer two (first section) may be about 5.8 microns and the thickness from the top of the metal layer 42 to the top of the metal layer 44 of wafer three (second section) may be about 4.8 microns. This creates an aspect ratio during processing of the first section of approximately 1:2 where the width of the interconnect structure 48 is about 2.8 microns. Also, the aspect of the second section is less than 1:3 where the width of the interconnect structure in this section is about 2 microns.

Figure 11:
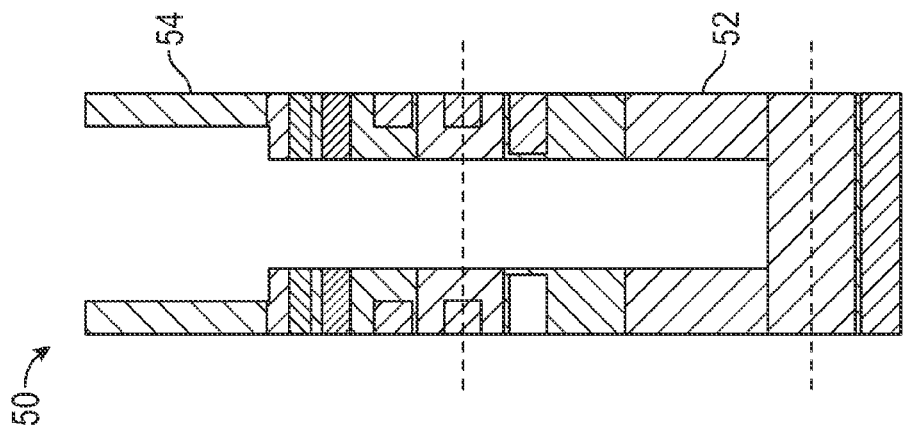
FIG. 11 is a cross sectional view of a three wafer die stack after a second set of processing operations for a third implementation of a method of forming a die stacked image sensor.
Figure 10:
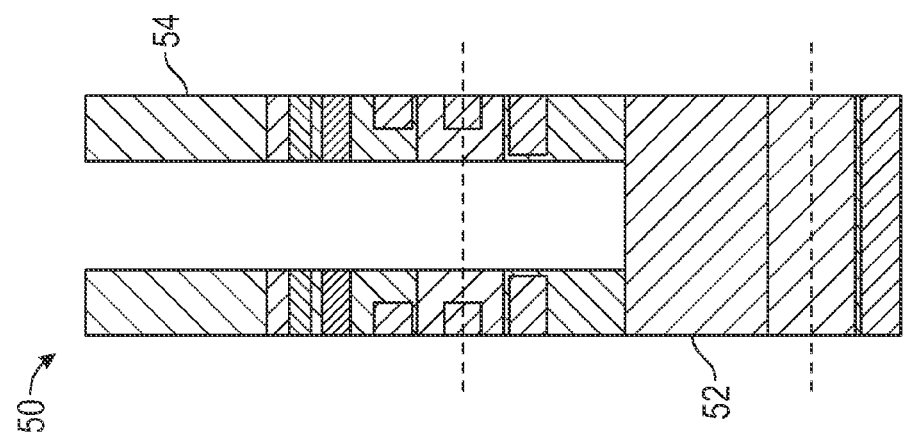
FIG. 10 is a cross sectional view of a three wafer die stack after a first set of processing operations for a third implementation of a method of forming a die stacked image sensor.
Figure 13:
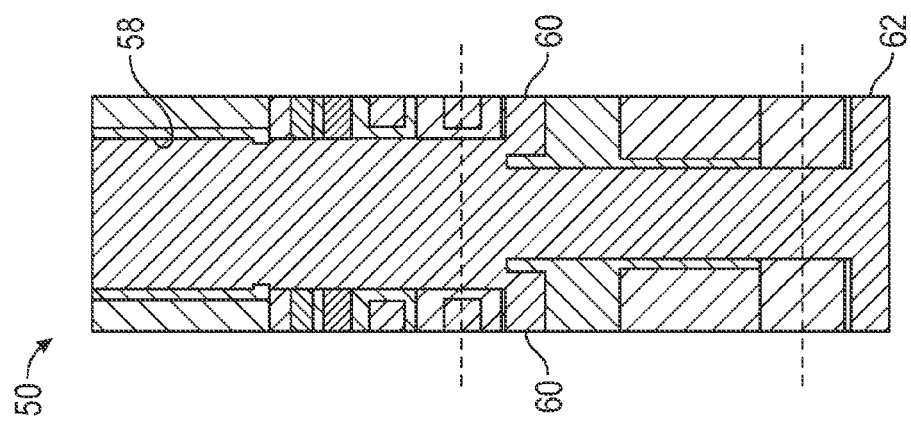
FIG. 13 is a cross sectional view of a three wafer die stack after a fourth set of processing operations for a third implementation of a method of forming a die stacked image sensor.
Figure 12:
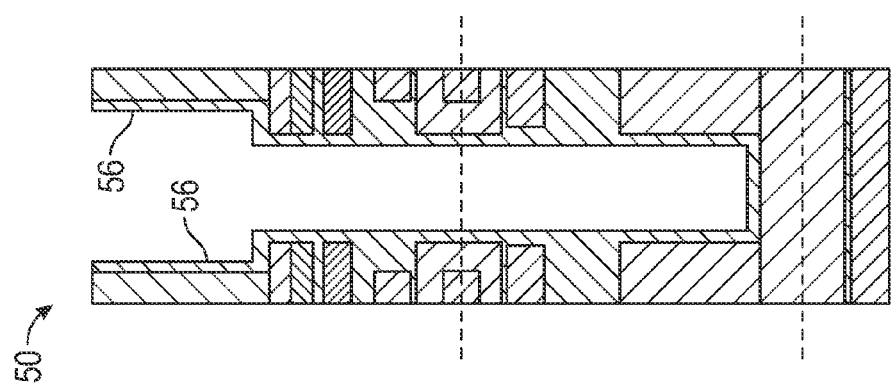
FIG. 12 is a cross sectional view of a three wafer die stack after a third set of processing operations for a third implementation of a method of forming a die stacked image sensor.

Referring to FIG. 10, a cross section 50 of a three wafer die stack following a first set of processing operations for a third implementation of a method of forming a die stacked image sensor is illustrated. As illustrated, the cross section shows the structure following patterning and etching of the silicon 54 of the first wafer, and the ILD and other non-metallic layers of wafers one and two down to the surface of the silicon 52 of the second wafer. Referring to FIG. 11, the structure of the cross section 50 is illustrated after the silicon 52 of the second wafer has been fully etched through following patterning, and the silicon of the first wafer 54 has also been etched, widening the opening in the first wafer. Referring to FIG. 12, the cross section 50 structure now illustrates the silicon dioxide passivation layer 56 now deposited over the interior of the opening. This oxide passive layer 56 serves to protect the devices of the first wafer (first die) and the second wafer (second die) from metal or other ionic contamination during subsequent processing or during operation. Referring to FIG. 13, the cross section 50 is shown after the oxide between the opening and the metal layer 62 of the third wafer has been completed to create the interconnect structure 58, which electrically couples the metal layer 60 of the second wafer with the metal layer 62 of the third wafer. In this way, the electrical components of the second wafer are electrically coupled with the routing circuitry of the third wafer. In other implementations, however, the interconnect structure 58 could be used to connect a metal layer associated with the first wafer with the metal layer 62 of the third wafer, depending upon how the patterning of metal layers in wafers one, two, and three is done. In some implementations, the various interconnect structures could be used to electrically coupled metal layers in all three wafers together.

In various implementations, for the exemplary purposes of this disclosure, the width of the initial opening illustrated in FIG. 10 is about 2 microns and the aspect ratio needed to form this opening is less than 1:4, as the initial depth of the opening is about 7.4 microns. The subsequent silicon etch widens the opening in the first wafer to about 3.2 microns, so with a thickness of 2.5 microns, the aspect ratio of this opening becomes less than 1:1. During the metallization process, following the sidewall oxide deposition, the width of the opening at the top of the metal layer 60 of the second wafer is about 2.6 microns. As the thickness of the layers from the edge of sidewall oxide on the silicon 54 of the first wafer to the top of the metal layer 60 of the second wafer is about 3.5 microns, the aspect ratio of the opening is less than 1:2. As previously discussed, these aspect ratios may be within the standard processing capabilities of conventional semiconductor process tools.

The implementations of interconnect structures 38, 48, 58 in the various implementations illustrated in the drawings are TOVs, as they pass through an oxide/oxide fusion bond. Implementations of interconnect structures may also be TSVs, where fusion bonds and just hybrid bonds are utilized.

Figure 14:
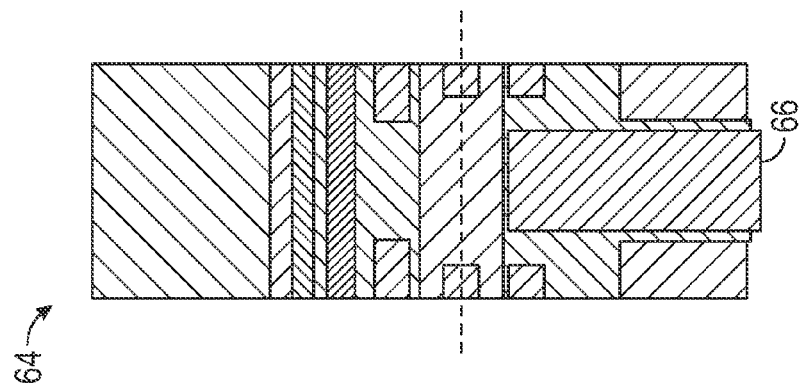
FIG. 14 is a cross sectional view of a two wafer die stack after a first set of processing operations for a fourth implementation of a method of forming a die stacked image sensor.
Figure 15:
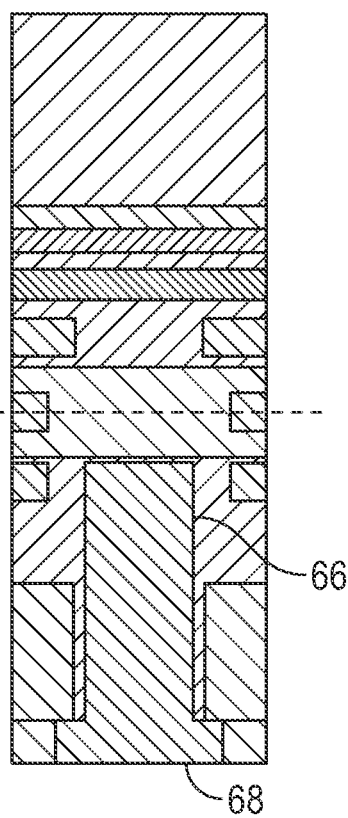
FIG. 15 is a cross sectional view of a two wafer die stack after a second set of processing operations for a fourth implementation of a method of forming a die stacked image sensor.

Referring to FIG. 14, a cross section 64 of a two wafer die stack after a first set of processing operations for a fourth implementation of a method of forming a die stacked image sensor is illustrated. As illustrated, the first wafer and second wafer have been hybrid bonded together where indicated by the dotted line. Wafer two has been thinned down mechanically and/or chemically to expose stud 66 that was previously formed within the structure of wafer two during processing of wafer two. In other method implementations, however, wafer two may be hybrid bonded to wafer three first before being thinned to expose stud 66 or processed to create stud 66. Wafer two in this method implementation is then subsequently hybrid bonded to wafer one. Referring to FIG. 15, the cross section 64 is now illustrated following passivation of the exposed silicon surface of wafer two and the addition of a pad 68 structure to the stud 66. In various implementations, the stud 66 and pad may be made of the same materials or different materials and can be formed by any deposition or electrodeposition process. In particular implementations, they may be made of copper metal. In some implementations however, the stud 66 may be formed after thinning of the second wafer and bonding to wafer 1 by patterning the thinned side of the second wafer, etching an opening in the silicon, passivating the sidewalls, and electroplating the metal material, using similar processes as those disclosed herein.

Figure 16:
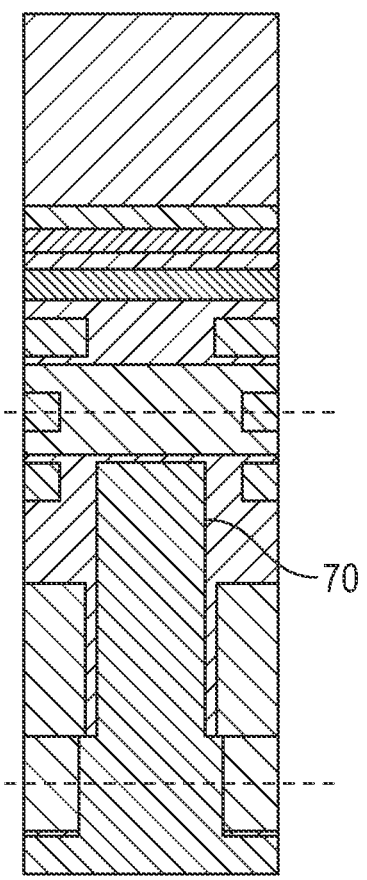
FIG. 16 is a cross sectional view of a three wafer die stack after a third set of processing operations for a fourth implementation of a method of forming a die stacked image sensor and bonding of the third wafer.

Referring to FIG. 16, the cross section 64 is illustrated following hybrid bonding of the third wafer to the pad 68 of the second wafer forming an interconnect structure 70. In this way, the devices of the second wafer (second die) are electrically coupled with the signal processing circuitry of the third wafer (third die). The interconnect structure 70 formed using the fourth method is a TSV, as the interconnect 70 passes through hybrid bonded structures and not fusion oxide bonded structures.

Figure 19:
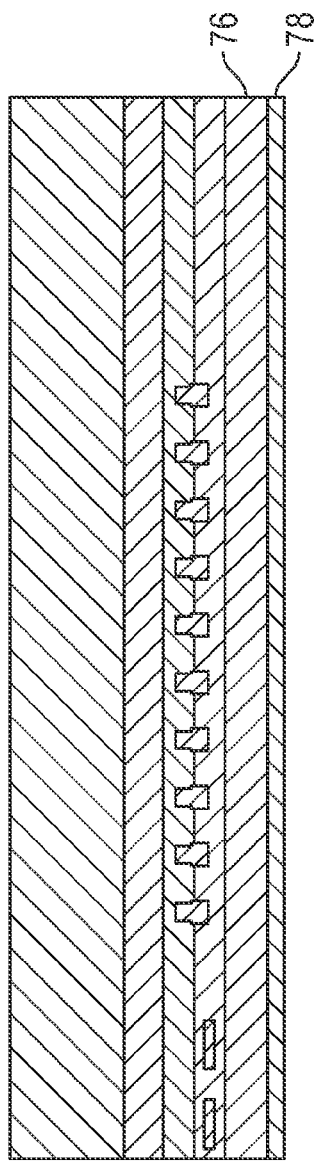
FIG. 19 is a cross sectional view of a die stacked image sensor following deposition of oxide on the second wafer.
Figure 20:
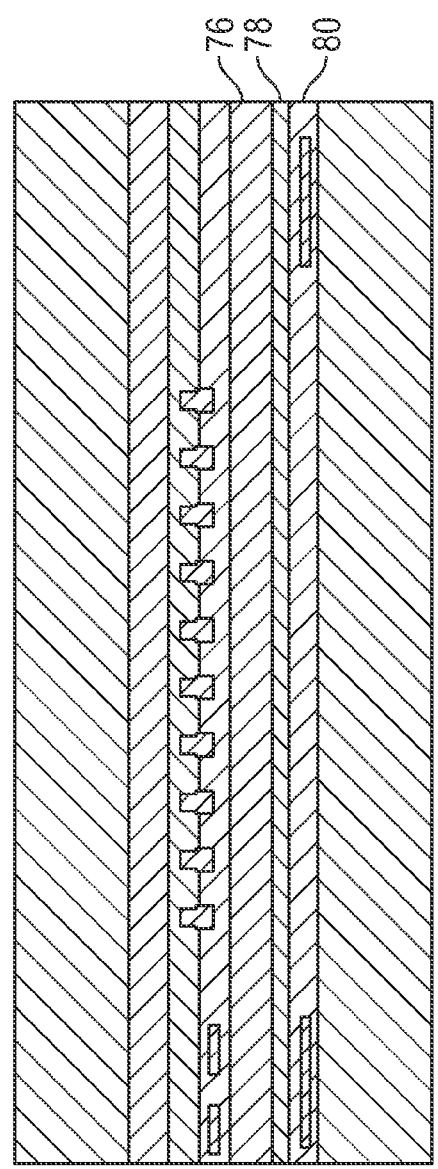
FIG. 20 is a cross sectional view of a die stacked image sensor following fusion bonding of the second wafer with a third wafer.

FIGS. 17-23 disclose a broader die-level process view of the processing steps in the third implementation of a method of forming a die stacked image sensor. Referring to FIG. 17, a first wafer containing a plurality of die each containing a pixel array has been hybrid bonded to a second wafer through copper structures that form the pixel level stacking interconnects 72. The silicon layer 74 and epi (epitaxial silicon) layer 76 of the second wafer can be observed in this cross section prior to wafer thinning Referring to FIG. 18, the two bonded wafers are now shown following wafer thinning, where it can be observed that the silicon 74 of the second wafer has been completely removed. This thinning process can be any disclosed in this document. Referring to FIG. 19, the two wafer stack is illustrated following the deposition of a layer of oxide 78 on the epi layer 76 of the second wafer in preparation for bonding. FIG. 20 illustrates the three wafer stack following fusion bonding of the third wafer to the second wafer through the layer of oxide 78 and a layer of oxide 80 on the third wafer.

Figure 21:
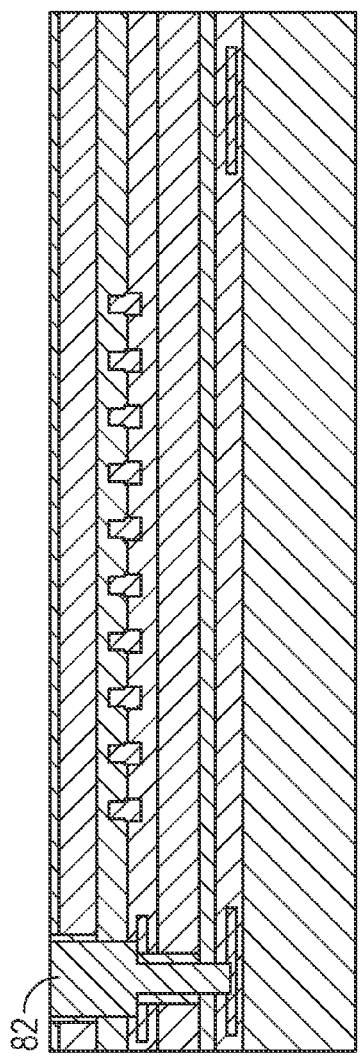
FIG. 21 is a cross sectional view of a die stacked image sensor following creation of a through oxide via (TOV)

At this point, the three wafer stack is at the point prior to the initial ILD and oxide etch and subsequent processing steps illustrated in FIGS. 10-13. FIG. 21 illustrates the resulting TOV 82 formed following grinding down of wafer one and which electrically couples the signal processing circuity of wafer three (die three) with the electrical components of wafer two (die two). Backgrinding of wafer one may occur when the image sensor is intended to be a backside illuminated (BSI) sensor.

Figure 22:
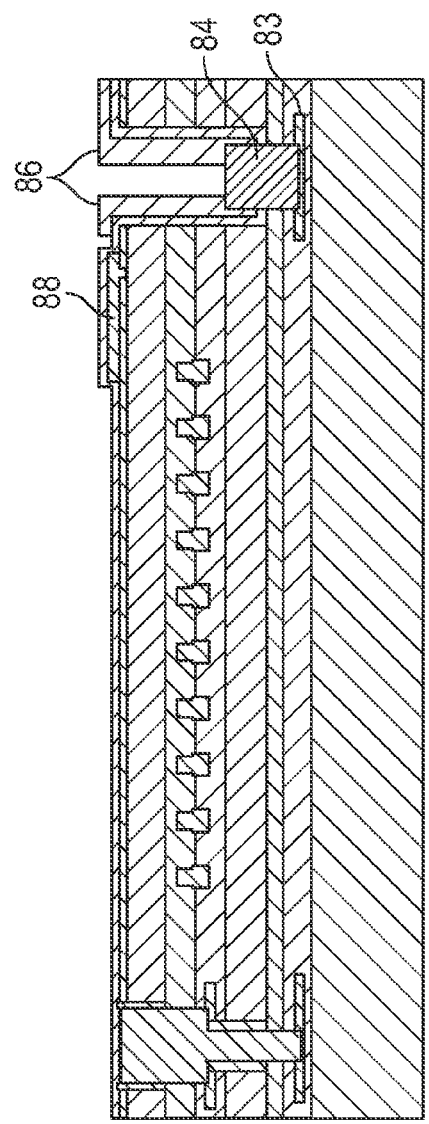
FIG. 22 is a cross sectional view of a die stacked image sensor following creation of a tungsten shield and aluminum bond pad.
Figure 23:
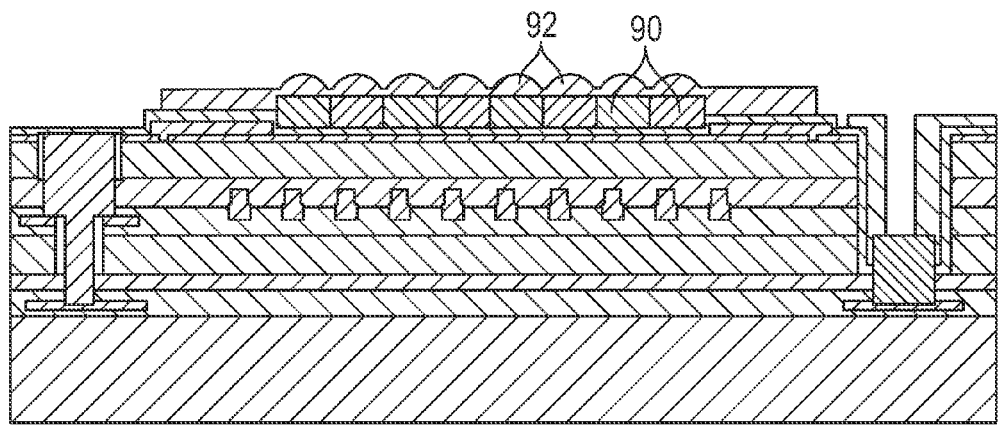
FIG. 23 is a cross sectional view of a die stacked image sensor following formation of microlenses on the surfaces of the pixel array.

At this point, the wafer is ready for additional processing steps which will add additional components needed to prepare it as an image sensor for various interconnects and other enhancement structures. FIG. 22 illustrates the three wafer stack following formation of an aluminum bond pad 84 coupled to a pad 83 in the third wafer along with passivation layers 86 and the creation of a tungsten shield/ground structure 88 on the surface of the first wafer adjacent to the pixel array. FIG. 23 illustrates the three wafer stack following additional processing to add a color filter array (CFA) 90 and/or microlens array 92 above and coupled with the pixel array. The microlens array 92 serves to focus incident light on the pixels, enhancing each pixel's signal. The CFA 90 serves to help identify the particular color of the light being focused on a particular pixel by filtering the light actually striking the pixel surface to a desired color. In particular implementations, the CFA 90 may be used to filter the light incident on the pixels to enable their outputs to be coded detect red, green, and blue light. Those of ordinary skill in the art will readily appreciate the particular processing techniques used to create the microlens array 92 and the CFA 90. They will also readily appreciate the processing steps used to add other components to the stacked die image sensor and to singulate the stacked die from each other.

In places where the description above refers to particular implementations of die stacked image sensors and implementing components, sub-components, methods and sub-methods, it should be readily apparent that a number of modifications may be made without departing from the spirit thereof and that these implementations, implementing components, sub-components, methods and sub-methods may be applied to other die stacked image sensors.

What is claimed is:

1. A method of manufacturing an image sensor, the method comprising:
    hybrid bonding a first wafer comprising a plurality of first die with a second wafer comprising a plurality of second die;
    thinning the second wafer;
    hybrid bonding the second wafer with a third wafer comprising a plurality of third die;
    exposing a plurality of studs comprised in the second wafer;
    wherein the plurality of first die each comprise a plurality of detectors adapted to convert photons to electrons;
    wherein the plurality of second die each comprise a plurality of one of transistors, passive electrical components, and both transistors and passive electrical components; and
    wherein the plurality of third die each comprise one of analog circuitry, logic circuitry, and analog circuitry and logic circuitry.

2. The method of claim 1, wherein the plurality of second die are electrically coupled with the plurality of third die.

3. The method of claim 1, further comprising forming a plurality of microlenses on a surface of the plurality of the detectors adapted to convert photons to electrons of each of the plurality of first die.

* * * * *